United States Patent
Moriceau et al.

(10) Patent No.: US 9,922,954 B2
(45) Date of Patent: Mar. 20, 2018

(54) METHOD FOR PERFORMING DIRECT BONDING BETWEEN TWO STRUCTURES

(71) Applicant: COMMISSARIAT À L'ENERGIE ATOMIQUE ET AUX ENERGIES ALTERNATIVES, Paris (FR)

(72) Inventors: Hubert Moriceau, Saint-Egrève (FR); Frank Fournel, Villard-Bonnot (FR); Christophe Morales, ST Pierre de Mesage (FR)

(73) Assignee: COMMISARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/388,594

(22) Filed: Dec. 22, 2016

(65) Prior Publication Data

US 2017/0179073 A1    Jun. 22, 2017

(30) Foreign Application Priority Data

Dec. 22, 2015  (FR) ...................................... 15 63134

(51) Int. Cl.
*H01L 21/76*   (2006.01)
*H01L 21/306*  (2006.01)
*H01L 23/00*   (2006.01)

(52) U.S. Cl.
CPC .............. *H01L 24/83* (2013.01); *H01L 24/27* (2013.01); *H01L 24/29* (2013.01);
(Continued)

(58) Field of Classification Search
CPC ....... H01L 21/76; H01L 21/762; H01L 21/56; H01L 21/768; H01L 21/306;
(Continued)

(56) References Cited

U.S. PATENT DOCUMENTS

2003/0211705 A1* 11/2003 Tong ................... H01L 21/0206
                                                          438/455
2007/0020947 A1   1/2007 Daval et al.
(Continued)

FOREIGN PATENT DOCUMENTS

EP    1901345 A1   3/2008
FR    2872625 A1   1/2006

OTHER PUBLICATIONS

Suni et al., "Effects of Plasma Activation on Hydrophilic Bonding of Si and SiO2", Journal of the Electrochemical Society, vol. 149, No. 6, pp. G348-G351, 2002.
Takagi et al., "Room-temperature Bonding of Oxide Wafers by Ar-beam Surface Activation", ECS Transactions, vol. 16, No. 8, pp. 531-537, 2008.

*Primary Examiner* — Chuong A Luu
(74) *Attorney, Agent, or Firm* — Oliff PLC

(57) ABSTRACT

This method includes steps a) providing the first structure and second structure, the first structure including a surface on which a silicon layer is formed; b) bombarding the silicon layer by a beam (F) of species configured to reach the surface of the first structure, and to preserve a part of the silicon layer with a surface roughness of less than 1 nm RMS on completion of the bombardment; c) bonding the first structure and second structure by direct bonding between the part of the silicon layer preserved in step b) and the second structure, steps b) and c) being executed in the same chamber subjected to a vacuum of less than $10^{-2}$ mbar.

16 Claims, 1 Drawing Sheet

(52) U.S. Cl.
CPC ............... *H01L 2224/275* (2013.01); *H01L 2224/2781* (2013.01); *H01L 2224/27831* (2013.01); *H01L 2224/27845* (2013.01); *H01L 2224/29082* (2013.01); *H01L 2224/29138* (2013.01); *H01L 2224/29187* (2013.01); *H01L 2224/29188* (2013.01); *H01L 2224/29193* (2013.01); *H01L 2224/29194* (2013.01); *H01L 2224/8309* (2013.01); *H01L 2224/83011* (2013.01); *H01L 2224/83048* (2013.01); *H01L 2224/83193* (2013.01); *H01L 2224/83896* (2013.01); *H01L 2924/01014* (2013.01); *H01L 2924/05442* (2013.01)

(58) Field of Classification Search
CPC ..... H01L 21/683; H01L 21/285; H01L 24/27; H01L 24/29; H01L 24/83
USPC ........................................................ 438/455
See application file for complete search history.

(56) References Cited

U.S. PATENT DOCUMENTS

2013/0193487 A1* 8/2013 Peroni ................... H01L 29/402
   257/194
2013/0299080 A1* 11/2013 Plach ..................... H01L 21/187
   156/272.6

* cited by examiner

METHOD FOR PERFORMING DIRECT BONDING BETWEEN TWO STRUCTURES

BACKGROUND OF THE INVENTION

The present invention relates to a bonding method of a first structure and a second structure. More precisely, the invention relates to a bonding method by direct bonding of surfaces, What is meant by "direct bonding" is spontaneous bonding resulting from placing two surfaces in direct contact, i.e. in the absence of an additional element such as a glue, a wax or a brazing. The bonding is mainly caused by the Van der Waals forces originating from the electronic interaction between the atoms or molecules of two surfaces, the hydrogen bonds due to the surface preparations or the covalent bonds established between the two surfaces. Bonding by molecular adhesion can also be referred to.

Conventionally, a high bonding strength (i.e. with a separation energy of more than 3 J·m$^{-2}$, a measurement made by inserting a blade at the bonding interface) is sought for while not involving any heat treatment of the bonding interface at high temperature, typically more than 100° C.

STATE OF THE ART

It is known from of the state of the art to use surface activation by plasma-based treatments or by polishing techniques. Such surface activations enhance the bonding strength but do not enable a bonding energy of more than 3 J·m$^{-2}$ to be obtained without applying heat treatment at a temperature of more than 100° C.

It is also known from of the state of the art, in particular from the document T. Suni et al., "*Effects of plasma activation on hydrophilic bonding of Si and SiO$_2$*", Journal of The Electrochemical Society, 149 (6) G348-G351 (2008), to activate silicon oxide surfaces by means of an RF plasma under an oxygen atmosphere. Such a surface activation does not enable a bonding energy of more than 3 J·m$^{-2}$ to be obtained, while applying heat treatment at a temperature of more than 100° C.

It is further known from of the state of the art, in particular from the document H. Takagi et al., "*Room-temperature Bonding of Oxide Wafers by Ar-beam Surface Activation*", ECS Transactions, 16(8), pp. 531-537 (2008), to activate surfaces of two silicon wafers by argon ion beam. The separations of the bondings of the silicon wafer treated in this way take place by breaking of silicon in at least one of the wafers, which means a high bonding energy, estimated to be more than 4 J·m$^{-2}$. However, as the same article shows, this surface activation is inoperative when the two silicon wafers are covered by a silicon oxide film before surface activation or when the wafers are mainly made from silicon oxide. The bonding energy obtained is only about a few hundred mJ·m$^{-2}$ at ambient temperature, and remains lower than 2 J·m$^{-2}$ in spite of heat treatment at 200° C.

SUMMARY OF THE INVENTION

Accordingly, the object of the present invention is to totally or partially remedy the above-mentioned shortcomings, and relates for this purpose to a bonding method of a first structure and a second structure, comprising the following steps:

a) providing the first structure and second structure, the first structure comprising a surface on which a silicon layer is formed;

b) bombarding the silicon layer by a beam of species configured to reach the surface of the first structure and to preserve a part of the silicon layer with a surface roughness of less than 1 nm RMS at the end of bombardment;

c) bonding the first structure and second structure by direct bonding between the part of the silicon layer preserved in step b) and the second structure, steps b) and c) being executed in the same chamber subjected to a vacuum of less than 10$^{-2}$ mbar.

Such a method according to the invention thus makes it possible to envisage obtaining a bonding energy of more than 3 J·m$^{-2}$, while circumventing the need for heat treatment of the bonding interface at a temperature of more than 100° C.

Such a step b) in fact enables:

the silicon layer formed in step a) to be abraded when the latter presents a larger thickness than the penetration depth of the species (such as ions), and the desired thickness to be achieved for the preserved part of the silicon layer, the interface between the silicon layer and the surface of the first structure to be strengthened, in terms of bonding, due to their mixing by the bombarded species when the thickness of the silicon layer formed in step a) is—or becomes after abrasion—smaller than or equal to the penetration depth of the species (such as ions), and the surface of the silicon layer to be activated in the sense of preparing the surface for it to be bonded in step c). The purpose of such a preparation is in particular to generate silicon dangling bonds at the surface, which is made possible by a high vacuum in the chamber, preferentially less than 10$^{-4}$ mbar, more preferentially less than 10$^{-5}$ mbar, even more preferentially less than 10$^{-6}$ mbar.

To do this, the beam of species is configured to reach the surface of the first structure without completely abrading the silicon layer. The surface of the preserved part of the silicon layer is thus activated (in the sense of prepared) and its mixing with the material of the surface of the first structure (for example a silicon oxide) is obtained by means of the bombarded species, which thereby enhances the adherence of the silicon layer deposited on a silicon oxide, as a non-restrictive example. What is meant by "configured to" is that the bombardment parameters (mainly the energy and current) and the treatment parameters (mainly the duration of the operation, the temperature and pressure) are chosen according to the nature of the species, advantageously ions to be accelerated (these ions being able to be more or less neutralised after their acceleration), to preserve a part of the silicon layer with a surface roughness of less than 1 nm RMS, and to reach the surface of the first structure. In other words, on completion of the bombardment of step b), the preserved part of the silicon layer comprises a free surface presenting a roughness of less than 1 nm RMS, preferentially less than 0.5 nm RMS, more preferentially less than 0.3 nm RMS, so as to remain compatible with the subsequent bonding of step c).

Quantification of the surface roughness is to be understood relatively to a quadratic mean surface roughness (Sq) of a reference surface, and is defined in the Standard ISO 25178 (formerly called Rq in the Standard ISO 4287, and also called Root Mean Square (RMS)). Sq is measured by a technique described in the Standard ISO 25178, for example by means of Atomic Force Microscope (AFM) scanning on a reference surface of 1*1 μm$^2$.

Furthermore, to do this, steps b) and c) are performed in a high vacuum and without vacuum breaking. For example, the high vacuum can be a secondary vacuum of less than $10^{-2}$ mbar, or an ultra-high vacuum at $10^{-7}$ mbar.

Advantageously, step b) is executed so that the preserved part of the silicon layer presents a thickness comprised between 0.2 nm and 5 nm, preferentially comprised between 1 nm and 5 nm, more preferentially comprised between 3 nm and 5 nm.

Such thicknesses thus enable the beam to reach the surface of the first structure thereby allowing mixing of the part of the surface of the first structure by the bombarded species, without requiring a too high energy (typically less than a few keV).

Furthermore, when the silicon layer formed in step a) presents a thickness much greater than 5 nm (for example 10 nm or 15 nm), the method preferentially comprises a prior step consisting in etching said silicon layer, by dry chemistry etching (bombardment, gas process) or by wet chemistry etching, so that the silicon layer presents a thickness of about 5 nm before step b).

According to an alternative, step b) comprises the following sub-steps:
s1) causing bombardment by mixing of the interface between the silicon layer and the surface of the first structure, the silicon layer presenting a thickness smaller than or equal to the penetration depth of the species;
s2) thickening the silicon layer by deposition;
s3) activating the surface of the silicon layer thickened in step s2) by bombardment, in the sense of preparing the surface for performing the bonding step c). The purpose of such a preparation is in particular to generate dangling bonds of silicon at the surface, which is made possible by a high vacuum in the chamber, preferentially less than $10^{-4}$ mbar, more preferentially less than $10^{-5}$ mbar, even more preferentially less than $10^{-6}$ mbar.

According to this alternative, the silicon layer can be subsequently thickened by deposition to reach thicknesses of more than 5 nm, for example 20 nm or 50 nm. Surface activation can then be induced by complementary ion bombardment.

Advantageously, the species of the beam comprise at least one element selected from the group comprising Ar, Ne, N, H, O, and He.

According to an alternative, the species of the beam comprise silicon atoms.

According to one embodiment, the first structure provided in step a) successively comprises:
a substrate made from a first material;
a layer made from a second material comprising the surface on which the silicon layer is formed.

According to one embodiment, the second structure provided in step a) successively comprises:
a substrate made from a first material;
a layer made from a second material on which direct bonding takes place in step c).

According to one form of execution, the second material of the layer is selected from the group comprising a silicon oxide, a silicon nitride, an aluminium nitride, an aluminium oxide, a silicon oxynitride, a silicon carbide, a diamond, a material of III-V type, a material of II-VI type, and a material of IV type.

What is meant by "material of A-B type" is a binary alloy between elements respectively situated in columns A and B of the periodic table of elements.

According to one form of execution, the first material of the substrate is selected from the group comprising silicon, a glass, a sapphire, a material of III-V type, a diamond, a silicon carbide, an alumina, a polymer, and a ceramic.

Advantageously, the first and second structures form a stack in step c), and step c) is executed by exerting a pressure on at least one free surface of the stack in the perpendicular direction to the free surface, the pressure being preferentially comprised between 5 and 30 bar.

Advantageously, the method comprises a step consisting applying a thermal annealing to the first structure before step b), the thermal annealing presenting a temperature T verifying $T<T_2$ where $T_2$ is the temperature above which the first structure is liable to be degraded.

The temperature T of the thermal annealing advantageously verifies $T>T_1$ where $T_1$ is the temperature above which gases included in the course of the depositions or reaction sub-products (for example hydrogen, water, hydrocarbons) diffuse out of the silicon layer.

According to one form of execution, the silicon layer is amorphous or polycrystalline.

What is meant by "amorphous" is that the part presents a mass degree of crystallinity of less than 20%.

What is meant by "polycrystalline" is that the silicon layer presents a mass degree of crystallinity comprised between 20% and strictly less than 80%.

What is meant by "monocrystalline" is that the silicon layer presents a mass degree of crystallinity equal to 100%.

According to one form of execution, the first structure provided in step a) comprises a silicon oxide formed on the silicon layer, and the method comprises a step consisting in removing the silicon oxide before step b).

The surface of the silicon layer is thus rendered hydrophobic.

According to one form of execution, step a) comprises a step consisting in depositing the silicon layer on the surface of the first structure, preferably at a temperature of less than 600° C., more preferentially less than 500° C.

Advantageously, the second structure provided in step a) comprises a surface on which an additional silicon layer is formed; the method comprises a step b1) consisting in bombarding the additional silicon layer by a beam of species configured to reach the surface of the second structure and to preserve a part of the additional silicon layer with a surface roughness of less than 1 nm RMS on completion of the bombardment, step b1) being executed in the same chamber subjected to the vacuum of less than $10^{-2}$ mbar; and step c) is executed so that the direct bonding takes place between the part of the silicon layer preserved in step b) and the part of the additional silicon layer preserved in step b1).

In similar manner, such a step b1) thereby enables:
the additional silicon layer formed in step a) to be abraded when the latter presents a thickness that is greater than the depth of the species (such as ions), and to reach the required thickness for the preserved part of the additional silicon layer,
the interface between the additional silicon layer and the surface of the second structure to be reinforced, in terms of bonding, due to the mixing by the bombarded species when the thickness of the additional silicon layer formed in step a) is—or becomes after abrasion— smaller than or equal to the penetration depth of the species (such as ions), and
the surface of the additional silicon layer to be activated in the sense of preparing the surface for bonding of the latter in step c). The purpose of such a preparation is in particular to generate silicon dangling bonds at the surface, which is made possible by a high vacuum in the chamber, preferentially less than $10^{-4}$ mbar, more preferentially less than $10^{-5}$ mbar, even more preferentially less than $10^{-6}$ mbar.

In other words, on completion of the bombardment of step b1), the preserved part of the additional silicon layer comprises a free surface presenting a roughness of less than 1 nm RMS, preferentially less than 0.5 nm RMS, more preferentially less than 0.3 nm RMS, so as to remain compatible with the subsequent bonding of step c).

According to a variant, the second structure provided in step a) comprises a surface on which direct bonding takes place in step c), and the method comprises a step consisting in bombarding the surface before step c) by a beam of species configured to preserve a surface roughness of less than 1 nm RMS.

In other words, on completion of the bombardment, the roughness of the surface of the second structure is less than 1 nm RMS, preferentially less than 0.5 nm RMS, more preferentially less than 0.3 nm RMS.

The surface of the second structure is thereby activated before the direct bonding of step c).

What is meant by "surface roughness" is a quadratic mean roughness defined in the Standard ISO 25178 and noted Sq.

Advantageously, the method does not comprise a thermal annealing step presenting a temperature of more than 100° C. after step c).

BRIEF DESCRIPTION OF THE DRAWINGS

Other features and advantages will become apparent from the following description of different embodiments of the invention, given for non-restrictive example purposes only, with reference to the appended drawings in which.

DETAILED DESCRIPTION OF THE EMBODIMENTS

Figure 1:
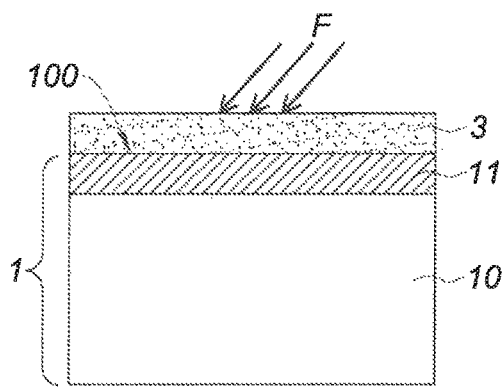
FIGS. 1 to 6 are schematic cross-sectional views illustrating steps of a method according to the invention.
Figure 2:
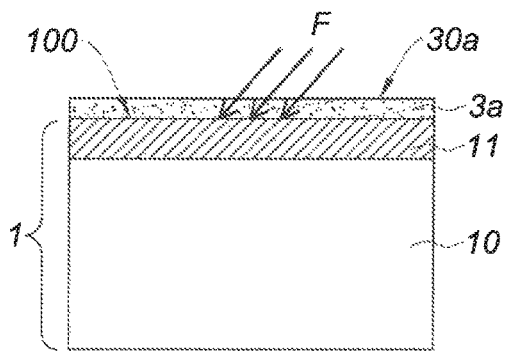

For the different embodiments, the same reference numerals will be used for parts that are identical or which perform the same function, for the sake of simplification of the description. The technical characteristics described in the following for different embodiments are to be considered either alone or in any technically possible combination.

The method illustrated in FIGS. 1 to 6 is a bonding method of a first structure 1 and a second structure 2, comprising the following steps:
a) providing the first structure 1 and second structure 2, the first structure 1 comprising a surface 100 on which a silicon layer 3 is formed;
b) bombarding the silicon layer 3 by a beam F of species configured to reach the surface 100 of the first structure 1, and to preserve a part 3a of the silicon layer 3 with a surface roughness of less than 1 nm RMS on completion of the bombardment;
c) bonding the first structure 1 and second structure 2 by direct bonding between the part 3a of the silicon layer 3 preserved in step b) and the second structure 2. Steps b) and c) are executed in the same chamber subjected to a vacuum of less than $10^{-2}$ mbar.

First Structure

As illustrated in FIG. 1, preferentially, the first structure 1 provided in step a) successively comprises:
a substrate 10 made from a first material;
a layer 11 made from a second material comprising the surface 100 on which the silicon layer 3 is formed.

The first material of the substrate 10 is advantageously selected from the group comprising silicon, a glass, a sapphire, a material of III-V type, a diamond, a silicon carbide, an alumina, a polymer, or a ceramic. The first material is either a single or a composite material.

The second material of the layer 11 is advantageously selected from the group comprising a silicon oxide, a silicon nitride, an aluminium nitride, an aluminium oxide, a silicon oxynitride, a silicon carbide, a diamond, a material of III-V type (for example GaAs or InP), a material of II-VI type (for example CdTe, ZnO, CdSe), or a material of IV type.

When the first material of the substrate 10 is silicon and when the second material of the layer 11 is a silicon oxide, silicon oxide can be formed on the substrate either by thermal oxidation or by a film deposition technique.

The method advantageously comprises a step consisting in planarizing the layer 11 before formation of the silicon layer 3, preferentially by a chemical mechanical polishing, so as to obtain a sufficiently low surface roughness (of about 2 Å RMS measured on an AFM scan of 1*1 µm$^2$), for the direct bonding of step c).

The method advantageously comprises a step consisting in cleaning the surface 100 of the first structure 1 before formation of the silicon layer 3, preferably by RCA cleaning.

Step a) preferentially comprises a step consisting in depositing the silicon layer 3 on the surface 100 of the first structure 1, preferably at a temperature of less than 600° C., more preferentially less than 500° C. The deposited silicon layer 3 is amorphous or polycrystalline. As an example, the silicon layer 3 can be deposited by physical or chemical vapor deposition.

Step a) advantageously comprises a step consisting in cleaning the surface of the silicon layer 3 formed, preferably by RCA cleaning. Such an RCA cleaning enables the particles or contaminations to be removed from the surface of the silicon layer 3 formed, while preserving a thin chemical oxide film (about 0.6 nm). The surface of the cleaned silicon layer 3 is then hydrophilic, with water droplet wetting angles of less than 2°.

According to an alternative, step a) advantageously comprises a step consisting in planarizing the silicon layer 3 formed, preferentially by a chemical mechanical polishing, so as to obtain a sufficiently low surface roughness (of about 2 Å RMS measured on an AFM scan of 1*1 µm$^2$), for the direct bonding of step c).

The first structure 1 provided in step a) can comprise a silicon oxide formed on the silicon layer 3. The method then advantageously comprises a step consisting in removing the silicon oxide before step b). Removal of the silicon oxide is advantageously performed by etching, preferably with a hydrofluoric acid solution. These etching is advantageously the last step executed before step b) (HF last) in order to prevent formation of an oxide at the surface of the silicon layer 3.

The method advantageously comprises a step consisting in applying thermal annealing to the first structure 1 before step b), the thermal annealing presenting a temperature T verifying $T<T_2$ where $T_2$ is the temperature above which the first structure 1 is liable to be degraded, for example 525° C. with an amorphous silicon layer 3.

The temperature T of the thermal annealing advantageously verifies $T>T_1$ where $T_1$ is the temperature above which gases included in the course of the depositions or reaction sub-products (for example hydrogen, water, hydrocarbons) diffuse out from the silicon layer. $T_1$ is for example comprised between 100° C. and 500° C.

Second Structure

Figure 6:
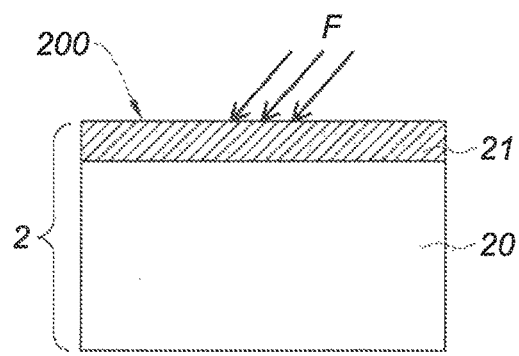

As illustrated in FIG. 6, preferentially, the second structure 2 provided in step a) successively comprises:
a substrate 20 made from a first material;
a layer 21 made from a second material comprising a surface 200 on which the direct bonding takes place in step c).

The first material of the substrate 20 is advantageously selected from the group comprising silicon, a glass, a sapphire, a material of III-V type, a diamond, a silicon carbide, an alumina, a polymer, or a ceramic. The first material is either single or composite.

The second material of the layer 21 is advantageously selected from the group comprising a silicon oxide, a silicon nitride, an aluminium nitride, an aluminium oxide, a silicon oxynitride, a silicon carbide, a diamond, a material of III-V type (for example GaAs or InP), a material of II-VI type (for example CdTe, ZnO, CdSe), or a material of IV type.

When the first material of the substrate 20 is silicon and when the second material of the layer 21 is a silicon oxide, silicon oxide can be formed on the silicon substrate either by thermal oxidation or by a film deposition technique.

The method advantageously comprises a step consisting in planarizing the layer 21 so as to obtain a sufficiently low surface roughness (of about 2 Å RMS measured on an AFM scan of 1*1 μm²) for the direct bonding of step c).

Step a) advantageously comprises a step consisting in cleaning the surface 200 of the layer 21, preferably by RCA cleaning, in order to remove the particles or contaminations from the surface 200.

Bombardment

Step b) is advantageously executed so that the preserved part 3a of the silicon layer 3 presents a thickness comprised between 0.2 nm and 5 nm, preferentially comprised between 1 nm and 5 nm, more preferentially comprised between 3 nm and 5 nm, Step b) is advantageously executed so that the preserved part 3a of the silicon layer 3 presents a thickness comprised between 0.2 nm and 10 nm, more preferentially comprised between 1 nm and 5 nm, even more preferentially comprised between 2 nm and 5 nm. When the silicon layer 3 formed in step a) presents a thickness much greater than 5 nm (for example 10 nm or 15 nm), the method preferentially comprises a step b0) consisting in etching said silicon layer 3, by dry chemistry etching or wet chemistry etching, so that the silicon layer 3 presents a thickness of about 5 nm before step b). Step b0) is a prior step to step b) or can take place during an initial phase of step b).

Bombardment is advantageously performed in step b) by means of an ion beam. This bombardment is commonly referenced as an Ion Beam Etching (IBE) step. The sources used can be:
Fast Atom Beam (FAB) for an argon bombardment in particular,
Kaufmann type where the ions are generated by collision with electrons confined in a magnetic field.

What is meant by "thickness" is the dimension along the perpendicular to the substrate 10. The species of the beam F advantageously comprise at least one element selected from the group comprising Ar, Ne, N, H, O, and He.

More precisely, the bombardment parameters (mainly the energy and current) and the treatment parameters (mainly the duration of the operation, temperature and pressure) are chosen such as:
to obtain an abrasion rate such that the preserved part 3a of the silicon layer 3 presents a thickness preferentially comprised between 3 nm and 5 nm,
to obtain a roughness of less than 1 nm RMS (or even less than 0.5 nm RMS, or even less than 0.3 nm RMS) at the free surface 30a of said preserved part 3a on completion of bombardment.

As an example, the abrasion rate of the silicon layer 3 can be comprised between 9 nm/min and 12 nm/min.

As illustrated in FIG. 6, step b) advantageously comprises a step consisting in bombarding the surface 200 of the layer 21 of the second structure 2 by a beam F of species. The beam F is configured for the surface 200 to keep a roughness of less than 1 nm RMS (or even less than 0.5 nm RMS, or even less than 0.3 nm RMS) on completion of bombardment. This results in abrasion of the layer 21 and activation of the surface 200. As an example, when the layer 21 is a silicon oxide, the abrasion rate of the layer 21 can be about 8.5 nm/min. This embodiment is used in the absence of an additional silicon layer 4 (illustration illustrated in FIG. 3, cf infra).

Bonding

The first and second structures 1, 2 form a stack in step c), and step c) is advantageously executed by exerting a pressure on at least one free surface of the stack in the perpendicular direction to the free surface, the pressure being preferentially comprised between 5 and 30 bar. The pressure is advantageously exerted on the two free surfaces of the stack by means of two plates.

The vacuum to which the chamber is subjected is advantageously comprised between $10^{-14}$ and $10^{-2}$ mbar, preferentially comprised between $10^{-8}$ and $10^{-4}$ mbar. The vacuum to which the chamber is subjected is preferentially less than $10^{-4}$ mbar, more preferentially less than $10^{-5}$ mbar, even more preferentially less than $10^{-6}$ mbar, which enables silicon dangling bonds to be preserved and the quality of bonding to be improved by creation of covalent bonds.

Additional Silicon Layer

Figure 3:
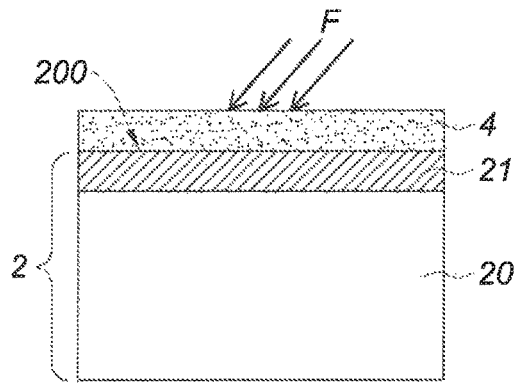
Figure 4:
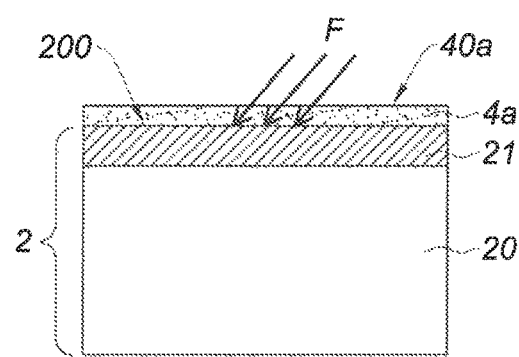
Figure 5:
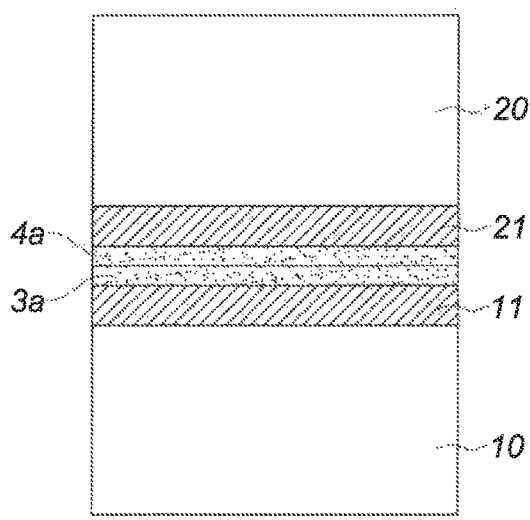

According to an embodiment illustrated in FIG. 3, the second structure 2 provided in step a) comprises a surface 200 on which an additional silicon layer 4 is formed. The method advantageously comprises a step b1) consisting in bombarding the additional silicon layer 4 by a beam F of species configured to reach the surface 200 of the second structure 2, and to preserve a part 4a of the additional silicon layer 4 with a surface roughness of less than 1 nm RMS on completion of bombardment (illustrated in FIG. 4). Step b1) is advantageously executed in the same chamber subjected to the vacuum of less than $10^{-2}$ mbar. Step c) is executed so that direct bonding takes place between the part 3a of the silicon layer 3 preserved in step b) and the part 4a of the additional silicon layer 4 preserved in step b1).

The technical characteristics described for the silicon layer 3 (and part 3a) also apply for the additional silicon layer 4 (and part 4a). In particular, the vacuum to which the chamber is subjected is preferentially less than $10^{-4}$ mbar, more preferentially less than $10^{-6}$ mbar, even more preferentially less than $10^{-6}$ mbar, which enables silicon dangling bonds to be preserved and the quality of bonding to be improved by creation of covalent bonds.

The characteristics described for the bombardment of step b) also apply for the bombardment of step b1).

In particular, the bombardment parameters of step b1) (mainly the energy and current) and the treatment parameters (mainly the duration of the operation, the temperature and pressure) are chosen so as:

to obtain an abrasion rate such that the preserved part 4a of the additional silicon layer 4 presents a thickness preferentially comprised between 3 nm and 5 nm, to obtain a roughness of less than 1 nm RMS (or even less than 0.5 nm RMS, or even less than 0.3 nm RMS) at the free surface 40a of said preserved part 4a on completion of bombardment.

Particular Exemplary Embodiment

The substrate 10 of the first structure 1 is made from silicon. The substrate 20 of the second structure 2 is made from silicon.

Layer 11 is a silicon oxide film with a thickness of 150 nm. Layer 21 is a silicon oxide film with a thickness of 150 nm. The silicon oxide film can be produced by heat treatment of the substrate 10, for example in a furnace, at 950° C., in an oxidizing atmosphere containing water vapour.

A silicon layer 3 with a thickness of 24 nm±2 nm is deposited on layer 11 by Remote Plasma-enhanced Chemical Vapor Deposition (RPCVD), for example at 550° C. An additional silicon layer 4 with a thickness of 24 nm±2 nm is deposited on layer 21 by RPCVD, for example at 550° C. The surfaces of the silicon layers 3, 4 present a roughness of about 0.3 nm RMS.

The silicon layers 3, 4 are subjected to a surface preparation treatment. The last step before step b) is removal of the surface oxide from the silicon layers 3, 4, for example by immersion in a hydrofluoric acid bath (HF last).

The first and second structures 1, 2 are then placed inside a vacuum chamber with a residual pressure of less than $10^{-6}$ mbar. The silicon layers 3, 4 are bombarded by a beam F of argon ions. The beam F presents an energy of 800 eV and a current of 77 mA. The pressure during the bombardment is $5.7*10^{-4}$ mbar.

The bombardment time is 2 min. The abrasion rate is 9.8 nm/min. The parts 3a, 4a of the silicon layers 3, 4 preserved after bombardment present a thickness of 4 nm±1 nm. On account of the energy equal to 800 eV and a small thickness of the parts 3a, 4a of the silicon layers 3, 4, a mixing is obtained at the deposition interface of the silicon layers 3, 4 on layers 11, 21 between the argon ions and the oxide of layers 11, 21.

As an example, keeping the other parameters as they are, an energy of the beam F of 1 keV leads to an abrasion rate of 12 nm/min. As an additional example, an acceleration voltage of 200 V and a current of 150 mA leads to an abrasion rate of silicon layers 3, 4 (polycrystalline or amorphous) of about 4 nm/min.

The bonding by direct bonding of step c) between the first and second structures 1, 2 takes place almost instantaneously after the parts 3a, 4a of the silicon layers 3, 4 have been placed in contact in a residual vacuum, and without vacuum breaking. Step c) is executed by exerting a pressure of 10 bar on a free surface of the stack 1, 2 in a direction perpendicular to the free surface.

According to a particular alternative embodiment, the initial thicknesses of the silicon layers 3, 4 are 15 nm. It is then possible to reduce the bombardment time to 1 min to obtain the parts 3a, 4a of silicon layers 3, 4 with a thickness of 4 nm±1 nm. Such a reduction of the bombardment time enables heating of the first and second structures 1, 2 to be reduced.

According to another alternative embodiment, the first structure 1 comprises a silicon film 3 (with a thickness of about 2 nm) on a SiO$_2$-based oxide layer 11. After bombardment (time of 60 seconds, acceleration voltage of 200 V and current of 150 mA) of the silicon film 3, the silicon film 3 is bonded onto a silicon surface of the second structure 2. A bonding of Si/amorphous Si/SiO$_2$ type is obtained for which a bonding energy of 3 J·m$^{-2}$±0.4 J·m$^{-2}$ was measured, whereas the same bonding without the amorphous silicon (and therefore without bombardment) leads to an energy of 0.6 J·m$^{-2}$.

The invention claimed is:

1. Method for bonding a first structure and a second structure, comprising the following steps:
   a) providing the first structure and a second structure, the first structure comprising a surface on which a silicon layer is formed;
   b) bombarding the silicon layer by a beam (F) of species configured to reach the surface of the first structure, and to preserve a part of the silicon layer with a surface roughness of less than 1 nm RMS on completion of the bombardment;
   c) bonding the first structure and second structure by direct bonding between the part of the silicon layer preserved in step b) and the second structure, steps b) and c) being executed in the same chamber subjected to a vacuum of less than, and remaining less than, $10^{-4}$ mbar.

2. Method according to claim 1, wherein step b) is executed so that the preserved part of the silicon layer presents a thickness of between 0.2 nm and 10 nm.

3. Method according to claim 1, wherein the species of the beam (F) comprise at least one element selected from the group consisting of Ar, Ne, N, H, O, and He.

4. Method according to claim 1, wherein the first structure provided in step a) successively comprises:
   a substrate made from a first material;
   a layer made from a second material comprising the surface on which the silicon layer is formed.

5. Method according to claim 1, wherein the second structure provided in step a) successively comprises:
   a substrate made from a first material;
   a layer made from a second material on which the direct bonding takes place in step c).

6. Method according to claim 4, wherein the second material of the layer is selected from the group consisting of a silicon oxide, a silicon nitride, an aluminium nitride, an aluminium oxide, a silicon oxynitride, a silicon carbide, a diamond, a material of III-V type, a material of II-VI type, and a material of IV type.

7. Method according to claim 4, wherein the first material of the substrate is selected from the group consisting of silicon, a glass, a sapphire, a material of III-V type, a diamond, a silicon carbide, an alumina, a polymer, and a ceramic.

8. Method according to claim 1, wherein the first and second structures form a stack in step c), and in that the step c) is executed by exerting a pressure on at least one free surface of the stack in the perpendicular direction to the free surface.

9. Method according to claim 1, wherein it comprises a step of applying a thermal annealing to the first structure before step b), the thermal annealing presenting a temperature T verifying $T<T_2$ where $T_2$ is the temperature above which the first structure is liable to be degraded.

10. Method according to claim 1, wherein the silicon layer is amorphous or polycrystalline.

11. Method according to claim 1, wherein the first structure provided in step a) comprises a silicon oxide formed on the silicon layer, and in that the method comprises a step of removing the silicon oxide before step b).

12. Method according to claim 1, wherein step a) comprises a step of depositing the silicon layer on the surface of the first structure.

13. Method according to claim 1, wherein the second structure provided in step a) comprises a surface on which an additional silicon layer is formed; in that the method comprises a step b1) of bombarding the additional silicon layer by a beam (F) of species configured to reach the surface of the second structure, and to preserve a part of the additional silicon layer with a surface roughness of less than 1 nm RMS on completion of the bombardment, step b1) being executed in the same chamber subjected to a vacuum of less than $10^{-4}$ mbar; and in that step c) is executed in such a way that direct bonding takes place between the part of the silicon layer preserved in step b) and the part of the additional silicon layer preserved in step b1).

14. Method according to claim 1, wherein the second structure provided in step a) comprises a surface on which the direct bonding takes place in step c); and in that the method comprises a step of bombarding the surface before step c) by a beam (F) of species configured to preserve a surface roughness of less than 1 nm RMS.

15. Method according to claim 1, wherein it does not comprise a thermal annealing step presenting a temperature of more than 100° C. after step c).

16. Method according to claim 1, wherein the first and second structures each has a substrate made from silicon;
 a silicon oxide film layer is deposited on each substrate;
 a silicon layer is deposited on each silicon oxide film layer;
 the silicon layers are each subjected to a surface preparation treatment and prior to step b), a surface oxide from the silicon layers are removed;
 step b) is carried out with Ar ions, by which parts of the silicon layers at their surfaces remain after bombardment, and a mixing is obtained at the deposition interface of the silicon layers on layers between the argon ions and the oxide of the remaining silicon oxide film layers.

* * * * *